United States Patent [19]

Manasevit

[11] 4,404,265

[45] Sep. 13, 1983

[54] EPITAXIAL COMPOSITE AND METHOD OF MAKING

[75] Inventor: Harold M. Manasevit, Anaheim, Calif.

[73] Assignee: Rockwell International Corporation, El Segundo, Calif.

[21] Appl. No.: 894,368

[22] Filed: Apr. 7, 1978

Related U.S. Application Data

[63] Continuation of Ser. No. 385,028, Aug. 2, 1973, abandoned, which is a continuation of Ser. No. 64,835, Oct. 1, 1969, abandoned, which is a continuation-in-part of Ser. No. 705,213, Feb. 13, 1968, abandoned.

[51] Int. Cl.$^3$ ............................................. H01L 29/20
[52] U.S. Cl. ..................................... 428/689; 148/33; 428/696; 428/697; 428/699; 428/700; 156/610; 156/611; 156/612
[58] Field of Search ............... 357/4; 148/1.5, 175, 148/33; 156/610, 611, 612; 428/689, 696, 697, 699, 700

[56] References Cited

U.S. PATENT DOCUMENTS

| | | | |
|---|---|---|---|
| 3,146,137 | 8/1964 | Williams | 148/175 |
| 3,218,205 | 11/1965 | Ruehrwein | 148/175 |
| 3,364,084 | 1/1968 | Ruehrwein | |
| 3,417,301 | 12/1968 | Galli | 148/175 |
| 3,424,955 | 1/1969 | Seiter | 148/175 |
| 3,433,684 | 3/1969 | Zarowick | 148/175 |
| 3,433,686 | 3/1969 | Marinace | 148/175 |
| 3,462,323 | 8/1969 | Grover | 148/175 |
| 3,476,593 | 11/1969 | Lehrer | 148/175 |
| 3,480,472 | 11/1969 | Dersin | 148/175 |
| 3,508,962 | 4/1970 | Manasevit | 148/175 |
| 3,674,552 | 7/1972 | Heywang | 148/175 |
| 3,830,654 | 8/1974 | Cho | 148/175 |

OTHER PUBLICATIONS

Richards et al., "Epitaxy of Compound Semiconductors by Flash Evaporation", J. Appl. Phys. 34, (1963) 3418.

Cox et al., "On the Preparation, Optical Properties and Electrical Behaviour of Aluminum Nitride", J. Phys. Chem. Solids, vol. 28, No. 4, Apr. 1967.

Manasevit, "A Survey of the Heteroepitaxial Growth of Semiconductor Films on Insulating Substrates", Journal of Crystal Growth 22, 1974, 125-148.

Maryska et al., "The Preparation and Properties of Vapor-Deposited Single Crystalline GaN", Applied Physics Letters, 15, No. 10, Nov. 15, 1969.

Tietjen et al., "The Preparation and Properties of Vapor-Deposited GaAs$_{1-x}$P$_x$ Using Arsine and Phosphine", Electrochemical Society Journal 113, 724 (1966).

Handbook of Chemistry and Physics, 42nd Ed. (1961-1962) Chem. Rubber Pub. Co., pp. 2681-2697, 2700-2710.

Primary Examiner—John D. Smith
Attorney, Agent, or Firm—H. Fredrick Hamann; Henry John Staas

[57] ABSTRACT

An epitaxial composite comprising a thin film of single crystal Group III-V wide band-gap compound semiconductor or semiconductor alloy on single crystal, electrically insulating oxide substrates such as sapphire, spinel, BeO, ThO$_2$, or the like, and on III-V semiconductors or alloys. The thin film may be produced in situ on a heated substrate by reaction of an organic compound containing the Group III constituent, typically tfhe alkyl metal organic, such as trimethylgallium and/or triethylgallium with a Group V hydride such as arsine, phosphine and/or stibine.

75 Claims, 3 Drawing Figures

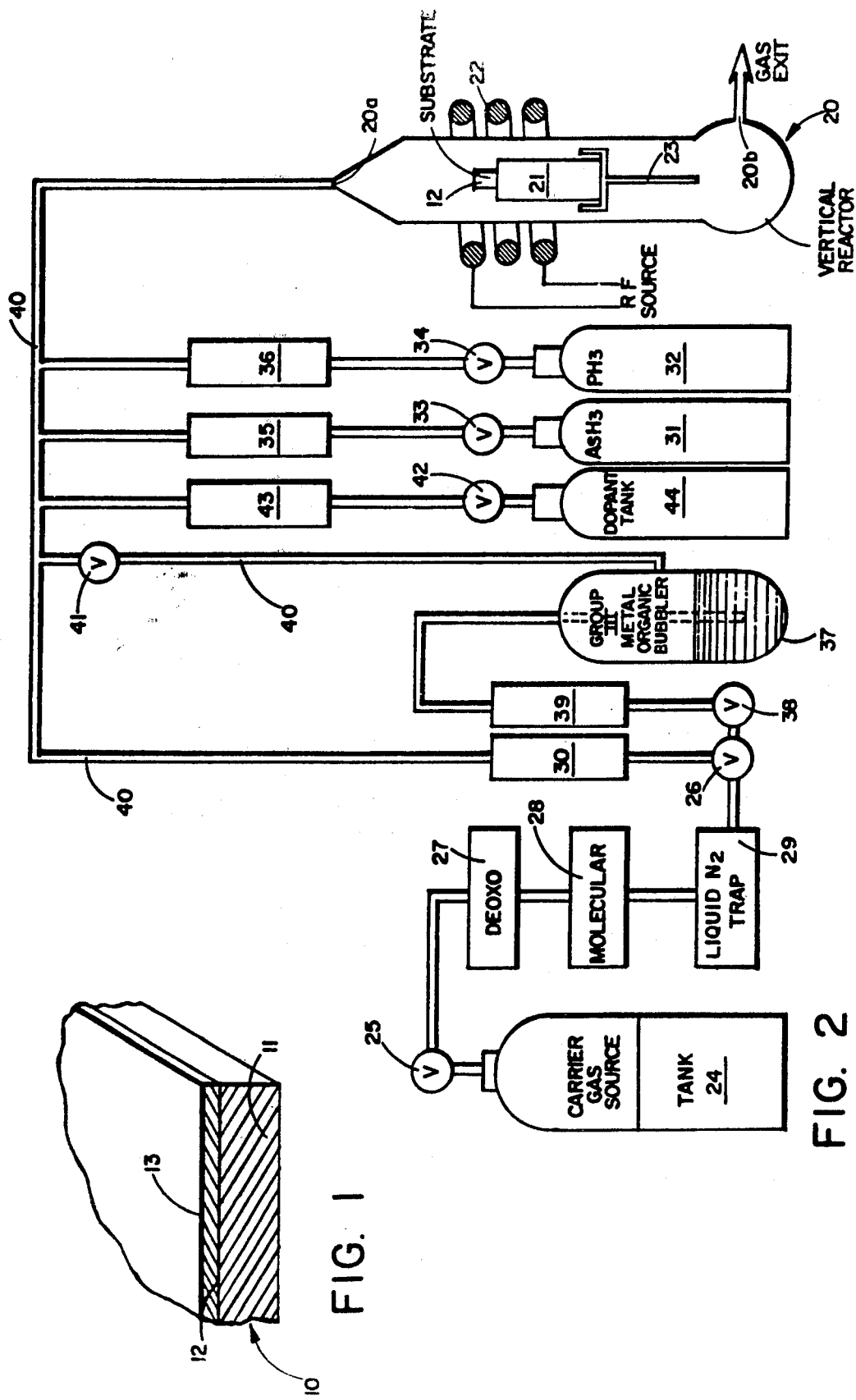

EPITAXIAL COMPOSITE AND METHOD OF MAKING

This is a continuation of U.S. patent application Ser. No. 385,028, filed on Aug. 2, 1973, now abandoned, which is a continuation of U.S. patent application Ser. No. 64,835, filed on October 1,1969, now abandoned, which is a continuation-in-part of U.S. patent application Ser. No. 705,213 filed Feb. 13, 1968 now abandoned.

BACKGROUND OF THE INVENTION

1. Field of Invention

The present invention relate to an epitaxial composite comprising a thin film of single crystal Group III–V compound semiconductor such as GaAs, GaP or $GaAs_{1-x}P_x$, $Ge_{1-y}Al_yAs$, $Ge_{1-y}In_yAs$, AlAs . . . ; InAs . . . and other solutions thereof on a single crystal, electrically insulating substrate. The invention also relates to a process for producing in situ the heteroepitaxial composite by reaction of an appropriate organic compound of the Group III constituent of the semiconductor in an atmosphere containing the Group V constituent of the semiconductor and/or its hydride.

2. Description of the Prior Art

As microelectronic technology improves, the search for better semiconductor materials becomes more intense. While post process technology has concentrated on the use of germanium and silicon for the formation of semiconductor devices, other semiconductor materials are becoming increasingly more important. Gallium arsenide (GaAs) and other zinc-blende III–V semiconductor compounds and alloys are considered to be among the most versatile of all semiconductor materials. For example, varactors, transistors, microwave diodes, light-emitting diodes, injection lasers, bulk microwave power sources, negative resistance amplifiers, and bulkeffect integrated circuits are all possible with gallium arsenide.

Although GaAs, Ge and Si all exhibit semiconducting properties, the differences between GaAs and the elemental semiconductors Ge and Si enhance gallium arsenide's potential usefulness. In GaAs, the minimum of the conduction band and the maximum of the valence band are such that direct electronic transitions can occur between the bands, allowing gallium arsenide to be used, for example, as an injection laser. This is not true for silicon or germanium.

Gallium arsenide has a higher electron mobility and a wider band gap than either germanium or silicon. Further, GaAs has two valleys in its conduction band, separated by an energy difference. Electrons in the lower-energy valley have a higher mobility than those in the higher-energy valley. As the voltage across a sample of GaAs is increased, more electrons are excited into the upper, lower-mobility valley and the current decreases, causing bulk instabilities such as the Gunn effect. This permits GaAs to be used for microwave power sources of types not possible for either silicon or germanium.

In the past, the primary obstacle to more extensive exploitation of GaAs has been its relative impurity compared with either germanium or silicon. These elemental semiconductor materials can be zone-refined in a vacuum after growth, but such purification has not been possible with GaAs. This impurity problem has meant; e.g., that high quality transistors could not be fabricated with previously available GaAs materials.

Two methods of crystal growth, the Czochralski and the horizontal Bridgman, may be used to grow from a melt bulk single crystal GaAs of relatively high purity. However, it is widely accepted that to obtain optimum purity, device-grade gallium arsenide, growth from the vapor phase is a preferred method of growth.

In the past, several techniques have been used to grow GaAs from the vapor phase onto GaAs substrates. Two such methods are described in the article entitled "Film-Making: A Delicate Job Performed Under Pressure" by Kenneth L. Lawley, *Electronics,* Nov. 13, 1967, beginning at page 114. In one technique described therein, bulk gallium arsenide is placed in one region of a horizontal reaction chamber and heated to a temperature of about 775 C. (775 degrees Centigrade). A chlorine source gas is introduced into the chamber which reacts with vaporized gallium to form $GaCl_3$. In a central region of the chamber, at a temperature of about 850 C., the $GaCl_3$ is mixed with arsine ($AsH_3$). The mixture then is passed over a GaAs substrate situated in a third region of the chamber heated to a temperature of about 750 C. The trichloride and the arsine each dissociate and combine to form an epitaxial GaAs film on the GaAs substrate.

Another technique described by Lawley requires the presynthesis of a mixture of GaAs in liquid gallium. This presynthesis is achieved in a horizontal reaction chamber exposing liquid gallium to arsenic trichloride. If the arsenic vapor presure exceeds the decomposition pressure of the GaAs-in-gallium solution at the operating temperature of about 850 C., a gallium arsenide skin forms on the gallium. This skin serves as the source of gallium arsenide for deposition onto a GaAs substrate located in another portion of the chamber and heated to a temperature (between 700 C. and 750 C.) lower than the temperature (800 C. to 850 C.) of the GaAs-in-gallium source.

These prior art vapor phase GaAs growth techniques suffer various shortcomings. First, the techniques all require the use of reaction chambers in which two or more regions of the chamber are heated to different, closely controlled temperatures. Such a multiple temperature requirement is difficult to implement in a production facility. Further, the prior art techniques each require use of gallium metal as a source material present in the deposition chamber. Gallium metal is difficult to obtain free of impurities because of its reactivity at high temperature with its container, and these impurities tend to vaporize in the chamber and contaminate the deposited GaAs film.

Moreover, all previous reports of successful vapor phase single crystal GaAs deposition have been on non-electrically-insulated substrates. A heteroepitaxial composite comprising a continuous film of single crystal III-V compound such as GaAs, GaP or the alloys; e.g., $GaAs_{1-x}P_x$, $Ga_{1-y}Al_yAs$, on a monocrystalline, electrically insulating substrate has not been achieved in the prior art. Such a composite is extremely valuable. For example, by producing single crystal gallium arsenide on an electrically insulating substrate, by performing appropriate device fabrication steps well known in the state-of-the-art, such as diffusion, epitaxial growth while dopant is added to the growing layer, photolithography, and other device fabrication steps, and subsequently etching away a portion of the gallium arsenide to form independent islands of the semiconductor or device structure on the insulator, it is possible; e.g., to manufacture very high density integrated circuits in gallium arsenide, while still achieving optimal electrical isolation between adjacent elements. Similarly, such an island configuration further permits electrical isolation between microwave or other components formed on adjacent GaAs islands.

In addition, at certain temperature levels some of the electrically insulating substrates; e.g., BeO and sapphire, exhibit very good thermal conductivity. Thus, a GaAs device; e.g., an amplifier, on a BeO or sapphire substrate can be operated at a wider temperature range than a device fabricated in bulk GaAs. In contrast, bulk GaAs, as a substrate material, has a low thermal conductivity which results in heating of the device and hence an increase in the noise of the amplifier. Accordingly, by fabricating the device; e.g., an amplifier, of GaAs on BeO or sapphire, the heat would be conducted away by the substrate, with concomitant decrease of noise. It is also important, when devices made from III–V material are in a high temperature environment, for the insulator to act as a heat sink and dissipate the heat either externally added or generated by the device.

The present invention provides an improved technique for depositing a film of single crystal gallium arsenide or the like epitaxially on a single crystal substrate. The substrate may be either electrically insulating or non-insulating. The technique utilizes a reaction chamber having only one high temperature zone, and permits production of single crystal films of very high purity. Furthermore, the preferred inventive technique; e.g., in the formation of GaAs, utilizes either trimethylgallium or triethylgallium, which compounds overcome the prior art limitation, expressed by Lawley (op. cit.) when he stated that, "Gallium-arsenide films are harder to grow than elemental semiconductors because there are no suitable gallium compounds that are gaseous at room temperature and atmospheric pressure."

Also, in the process of formation of the semiconductor thin film by the described process, side reactions have been substantially decreased to provide significant reduction in the impurity level. Accordingly, a level of purity and quality may be attained whereby the single crystal films that are formed may be fabricated into "Gunn-effect" devices, for example.

SUMMARY OF THE INVENTION

In accordance with the preferred embodiment of the present invention, there is provided a heteroepitaxial composite comprising a thin film of a single crystal Group III–V compound semiconductor such as GaAs, GaP, or $GaAs_{1-x}P_x$, AlAs, InAs, $Ga_{1-y}In_yAs$, $Ga_{1-y}Al_yAs$, or the like on a single crystal substrate. The substrate providing the aforementioned features and advantages may be electrically insulating, comprising; e.g., sapphire, of rhombohedral structure; spinel, thorium oxide, and gadolinium gallium garnet, cubic structure; BeO, hexagonal structure; chrysoberyl, orthorhombic structure; or the like.

There is further provided a novel process for producing the inventive composite, the process involving reaction of an organic compound of the semiconductor metal, typically the metal alkyl, with the hydride of the Group V constitutent of the semiconductor. In a preferred embodiment; for example, in the preparation of III–V gallium compounds or alloys, the alkyl comprises trimethylgallium (TMG) or triethylgallium (TEG) and the hydride comprises arsine, phosphine or stibine to produce the appropriate compounds or alloys: GaAs, GaP, $GaAs_{1-x}Sb_x$, $GaAs_{1-x}P_x$, ... and $GaP_{1-x}Sb_x$.

In a preferred embodiment, the substrate is positioned in a reactor and heated to within a temperature range of about 650 C. to about 800 C. in an atmosphere of the Group V constituent provided by decomposition of the constituent hydride. In the formation of GaAs semiconductors, gaseous TMG or TEG then is introduced into the reactor to form the Group III–V compound semiconductor epitaxially on the substrate.

Thus, it is an object of the present invention to provide new epitaxial composites.

Another object of the present invention is to provide a composite comprising a single crystal Group III–V compound or alloy semiconductor film on a monocrystalline substrate.

Yet another object of the present invention is to provide a heteroepitaxial composite comprising a thin film of single crystal III–V semiconductor or alloy such as GaAs, GaP, $GaAs_{1-x}P_x$, AlAs, $Ga_{1-y}Al_yAs$, InAs, $Ga_{1-y}In_yAs$, or the line on a single crystal, electrically insulating substrate such as sapphire, spinel, BeO, or the like.

It is another object of the present invention to provide a technique for producing an epitaxial composite comprising a semiconductor or alloy thin film on a single crystal substrate.

A further object of the present invention is to provide a method for producing a semiconductor thin film from the vapor phase deposition process for formation of semiconductor thin films of higher purity for certain devices by employing a carrier gas selected from the class of inert gases such as helium and argon.

Another object of the present invention is to provide improved semiconductor thin films by providing an excess of Group V hydrides during formation in the vapor deposition process.

It is yet another object of the present invention to provide a technique for producing a thin film of III–V semiconductor or alloy by reacting alkyl gallium, aluminum, indium compounds with the hydrides of arsenic, antimony and/or phosphorus at an elevated temperature.

Yet a further object of the present invention is to provide a technique for producing a monocrystalline thin film of III–V semiconductor or alloy such as GaAs, GaP, $GaAs_{1-x}P_x$, AlAs, $Ga_{1-y}Al_yAs$ or the like from the vapor phase in a reaction chamber having only one high temperature zone.

It is yet a further object of the present invention to produce a composite heteroepitaxial structure by heating a single crystal electrically insulating substrate in a reaction chamber and introducing into the chamber arsine, phosphine and/or stibine, and one of the Group III alkyl compounds such as trimethylgallium, triethylgallium, trimethylaluminum, triethylaluminum, trimethylindium, and triethylindium.

Another object of the present invention is to provide multilayer thin films of different semiconductor compounds or alloys such as GaAs, AlAs, and $Ga_{1-y}Al_yAs$ on a substrate or multilayers of a compound or compounds containing different type impurities which produce p or n doped layers.

BRIEF DESCRIPTION OF THE DRAWINGS

Still other objects, features, and attendant advantages of the present invention will become apparent to those skilled in the art by the following detailed description of the preferred embodiments constructed in accordance therewith, taken in conjunction with the accompanying drawings wherein like numerals designate like parts in the several figures and wherein:

FIG. 1 is a greatly enlarged, fragmentary perspective view, in partial section, of a heteroepitaxial composite in accordance with the preferred embodiment of the present invention.

FIG. 2 is a simplified schematic diagram of an apparatus for illustrating the inventive process for producing an epitaxial III-V semiconductor thin film on a single crystal substrate.

DESCRIPTION OF THE PREFERRED EMBODIMENTS

Figure 3:
FIG. 3 is a photomicrograph showing the surface characteristics of a thin film of monocrystalline (111) gallium arsenide prepared in accordance with the present invention on a single crystal electrically insulating substrate of spinel.

Referring now to the drawings, and more particularly to FIG. 1, there is shown a heteroepitaxial composite 10 in accordance with the present invention. Composite 10 comprises a substrate 11 of a single crystal zinc-blende semiconductor, or alloy semiconductor or single crystal, electrically insulating materials such as sapphire, spinel, BeO, $ThO_2$, $BaF_2$, $CaF_2$ or the like. Disposed atop surface 12 of substrate 11 is a thin film 13 of a monocrystalline Group III-V compound or alloy semiconductor. Preferably, thin film 13 comprises one of the gallium-V group such as gallium arsenide, gallium phosphide, or alloy compositions gallium arsenide-phosphide $GaAs_{1-x}P_x$ or gallium arsenide-antimonide $(GaAs_{1-x}Sb_x)$ or the like. Other groups are the aluminum-V compound or alloy semiconductors; e.g., AlAs, AlP, AlSb, $Ga_{1-y}Al_yAs$, $Ga_{1-y}Al_ySb$ and the indium-V compound or alloy semiconductor thin films; e.g., $Ga_{1-y}In_yAs$, InAs, or the like. Thin film 13 may also be a multilayer structure of different semiconductor compounds, or alloys such as GaAs or AlAs or $Ga_{1-y}Al_yAs$ disposed on surface 12, or of the same material containing layers of n-type doped and p-type doped, one upon the other. (In the chemical formula for the alloy, x or y represents a value between zero and one.) Composite 10, the cyrstallographic characteristics of which are discussed hereinbelow, may be produced in accordance with the inventive vapor phase deposition process now to be described.

Referring now to FIG. 2, there is shown an apparatus useful for practicing the inventive epitaxial deposition process. As shown therein, a vertical reactor 20 is provided with a pedestal 21 of a material, such as carbon covered by a film of silicon carbide, which can be inductively heated; e.g., by using RF heating coil 22 and an appropriate RF power source not shown. Pedestal 21 is supported axially within reactor 20, positioned so as to be heated by coil 22, by means of a suitable support 23. It should be understood, however, that the pedestal 21 can be tilted to accommodate changes in reactor shape etc. and gas flow pattern. Vertical reactor 20 is provided with an inlet 20a and an outlet 20b, the latter being connected to an appropriate gas exhaust indicated by the legend gas exit in FIG. 2. A carrier gas, typically hydrogen or helium, from tank 24 may be flowed through vertical reactor 20 by opening valves 25 and 26. As shown, the carrier, if hydrogen, may be purified by passage through a DEOXO unit 27, molecular sieves 28, and a liquid nitrogen cold trap 29, all well known in the vapor deposition art. The gas flow rate from tank 24 to reactor 20 is measured by a flow meter 30.

The system shown in FIG. 2 further comprises a pair of tanks 31 and 32 which contain repectively arsine and phosphine mixed in controlled volumetric amounts with hydrogen or an inert carrier gas. By opening valves 33 or 34 respectively, gaseous arsine or phosphine can be flowed through reactor 20. The flow rates of the arsine and phosphine are measured respectively by flow meters 35 and 36.

The metal organic compound used as a starting material in the inventive process is contained in liquid form in an appropriate stainless steel bubbler 37. If desired, bubbler 37 may be provided with a bath (not shown) to maintain the liquid compound at a desired temperature. Carrier gas flow into bubbler 37 is controlled by a valve 38, the flow rate being monitored by an individually regulated flow meter 39. The gas line 40 between bubbler 37 and the vertical reactor 20 may be provided with a heating jacket (not shown) when necessary to maintain the compound within line 40 in the vapor phase.

EXAMPLE I

As an illustrative example of the inventive process, the following procedure may be used to produce an epitaxial thin film 13 of gallium arsenide on a single crystal electrically insulating substrate 11 such as sapphire using arsine and trimethylgallium as the source materials.

First, the sapphire ($\alpha$-$Al_2O_3$) is appropriately sliced so that its deposition surface 12 exposes a known crystallographic plane; for example, the (0001) plane. Sapphire substrate 11 is positioned within vertical reactor 20 stop pedestal 21 with the deposition surface 12 facing gas inlet 20a. Initially, the carrier gas is flowed through the vertical reactor 20, by opening valves 25 and 26, to cleanse the system. A flow rate, typically on the order of 1.5 liters per minute, may be used.

The trimethylgallium (TMG) used as the Group III metal organic source material for the deposition is an alkyl compound having the chemical formula $(CH_3)_3Ga$. TMG exhibits a boiling point of 55.7 C. and a melting point of -15.8 C. Although TMG is a liquid at room temperature, better control of the vapor pressure may be obtained by maintaining the TMG in bubbler 37 at a temperature of 0° C. To accomplish this, bubbler 37 is immersed in an ice bath.

Substrate 11 is heated to a temperature of between about 650 C. and about 800 C. by means of RF induction coil 22. Maintaining substrate 11 at least above the boiling point of arsenic (boiling point=610 C. at one atmosphere) insures that pure arsenic will not deposit thereon.

Next, valve 33 is opened to permit a flow of arsine from tank 31 into vertical reactor 20. Preferably, the flow rate of arsine is adjusted to introduce into reactor 20 an excess of arsine over that stochiometrically required for the reaction (1) given below. Typically with arsine concentration in tank 31 of about 10% in hydrogen or helium, a flow rate of about 250cc per minute of the mixture or about 25cc per minute of pure arsine, through flow meter 35, is appropriate for deposition.

Next, valves 38 and 41 are opened and the carrier gas is permitted to flow through bubbler 37, thereby introducing gaseous TMG into reactor 20. A typical range of flow rates for gas through the bubbler, as measured by flow meter 39, is from about 3.5 cc per minute to about 120 cc per minute.

The TMG reacts with the arsine supplied from tank 31, to produce single crystal gallium arsenide, in situ, atop heated substrate 11. Although the decomposition temperature of GaAs at one atmosphere pressure is about 625 C., a temperature below that of heated substrate 11, the GaAs film formed on substrate 11 does not decompose due to the excess arsine pressure present in reactor 20.

In an alternative procedure, the vapors of the alkyl metal organic(s) and the hydride(s) are mixed in the proper proportions required to produce the compound and/or alloy semiconductor and decomposed at the heated pedestal at one atmosphere pressure as may be provided by a carrier gas such as He or H, or under a reduced pressure, as might be provided by the pure reactants without the use of a carrier gas.

The metal organic compounds and the hydrides, which are not diluted by a carrier gas and are under their own vapor pressures, are mixed either before or in the reaction chamber, depending upon their mutual chemical reactivity at room temperature, and decomposed on the heated substrate. For example, the amounts of material to be reacted may be adequately controlled by flowmeters placed between the reactant materials and a vacuum environment in the reactor portion; for example, as provided by evacuation of the vertical reactor via the gas exit.

While a free radical mechanism can be written to explain the formation of GaAs from TMG and AsH$_3$, it is also possible that the controlling reaction is the following:

$$(CH_3)_3Ga + AsH_3 \rightarrow GaAs + 3CH_4 \qquad (1)$$

From this equation (1), the stoichiometric amount of arsine required to produce GaAs from a given amount of TMG may be calculated.

A similar technique is used to grow an epitaxial gallium arsenide film 13 from triethylgallium (TEG), which source material has the chemical formula $(C_2H_5)_3Ga$, and exhibits a boiling poing of 143 C. Since the boiling point of TEG is higher than that of TMG, sufficient vapor is better obtained if the TEG is kept in liquid form in bubbler 37 at room temperature or above. However, it often is desirable to heat line 40 between bubbler 37 and reactor 20 to maintain the TEG in the vapor phase as it is being transported to reactor 20. The process reaction may be descirbed by the equation:

$$(C_2H_5)_3Ga + AsH_3 \rightarrow GaAs + 3C_2H_6 \qquad (2)$$

The stoichiometrically required amount of arsine, for a preselected amount of TEG, may be calculated from this equation (2).

As noted earlier, the arsine initially is preferably introduced into vertical reactor 20 at a flow rate adjusted to provide an excess of arsine over that stoichiometrically required for reaction (2). The TEG then is introduced into the chamber in flowing carrier gas. Gallium arsenide is formed in situ on substrate 11 which has been heated to a temperature range of between about 650 C. and about 800 C.

By substituting phosphine for arsine, the inventive process may be used to produce an epitaxial film of GaP. Since the equilibrium vapor pressure of phosphorus over GaP is greater than that of arsenic over GaAs, there is a tendency to lose phosphorus in the deposition reaction at a faster rate than arsenic is lost when growing GaAs films. For this reason, it is desirable to use a greater excess of phosphine over that stoichiometrically required than that excess required for arsine when forming GaAs. This considerable excess phosphine increases the effective pressure at the surface 12 on which film 13 is being formed.

The formation of the Group III-V alloys, for example, $GaAs_{1-x}Sb_x$, can be accomplished by mixing stibine ($SbH_3$) with $AsH_3$ in the appropriate proportions and reacting the gas mixture with TMG at the heated pedestal to form the $GaAs_{1-x}Sb_x$.

If desired, a III-V semiconductor or alloy epitaxial film may be doped during formation. To accomplish this, during film deposition a controlled amount of an appropriate dopant is introduced in the gas phase into reactor 20, via valve 42 and flow meter 43, from a container 44 (see FIG. 2). If an n-type semiconductor film 13 is desired, selenium (Se) or sulphur (S), for example, may be introduced in the present process in the form of $H_2Se$ or $H_2S$, which gaseous hydride would be contained in container 44 in pure or diluted form. In the reactor, the elevated temperature causes dissociation of the controlled amount of hydride to provide dopant for the thin film, and hydrogen. If an acceptor dopant is desired to provide a p-type semiconductor film 13, a suitable compound such as dimethylzinc, $(CH_3)_2Zn$, diethylzinc (DEZ), $(C_2H_5)_2Zn$, or dimethylcadmium may be provided in container 45. Dissociation of these compounds provides a zinc or cadmium dopant, respectively, and an organic by-product which is exhausted from the system by the carrier gas flow.

A film 13 of mixed alloy; for example, $GaAs_{1-x}P_x$ (where x may take any value between zero and one) also may be grown using the inventive process described herein-above. In this example, both arsine and phosphine are introduced into vertical reactor 20 during the deposition, by opening both of valves 33 and 34. The arsenic/phosphorus ratio may be altered by controlling the relative proportions of arsine and phosphine introduced into the deposition chamber. The resultant film 13 in this example comprises a solid solution of gallium arsenide-phosphide, and is formed epitaxially atop substrate 11.

The inventive process described herein-above has been used to grow GaAs, GaP, GaSb, $GaAs_{1-x}P_x$, $GaAs_{1-x}Sb$, AlAs, $Ga_{1-y}Al_yAs$, In As, and the like, single crystal films 13 epitaxially on a number of single crystal electrically insulating substrate 11 and on GaAs and the like. These electrically insulating substrates have included sapphire ($\alpha-Al_2O_3$), spinel ($MgAl_2O_4$), beryllium oxide (BeO), thorium oxide ($ThO_2$), gadolinium gallium garnet ($Ga_3Ga_5O_{12}$), chrysoberyl ($Al_2BeO_4$), calcium fluoride ($CeF_2$), and barium fluoride ($BaF_2$). In the latter two cases, $CaF_2$ and $BaF_2$, flaking of the deposited films was noted, possibly resulting from the difference in coefficient of thermal expansion between these substrates and the noted semiconductors. However, with the other substrates listed, excellent large area thin films were achieved. In each case, epitaxy was verified by X-ray and reflection electron diffraction studies. In addition, photographs of the surface microstructure of thin film 13 helped to identify the film as single crystal; for example, the photograph of FIG. 3.

For GaAs films, the crystallographic orientations between substrate 11 and film 13 have been determined for various single crystal, electrically insulating substrate materials and substrate. The following table sets forth some of the orientation relationships which have been observed.

TABLE I
Orientation Relationships Between Heteroepitaxial GeAs and Single Crystal, Electrically Insulating Substrates

| Substrate Plane | Parallel Relationships |
|---|---|
| (0001) $Al_2O_3$ | (111) GeAs ∥ (0001) $Al_2O_3$ |
| (11$\bar{2}$3) $Al_2O_3$ | (111) GeAs ∥ (11$\bar{2}$3) $Al_2O_3$ |
| (11$\bar{2}$5) $Al_2O_3$ | (111) GeAs ∥ (11$\bar{2}$5) $Al_2O_3$ |
| (01$\bar{1}$2) $Al_2O_3$ | (111) GeAs ∥ (01$\bar{1}$2) $Al_2O_3$ |
| (11$\bar{2}$6) $Al_2O_3$ | (111) GeAs ∥ (11$\bar{2}$6) $Al_2O_3$ |
| ABOUT 10° from (01$\bar{1}$2) $Al_2O_3$ | (110) GeAs ∥ (01$\bar{1}$2) $Al_2O_3$ |
| (100) $MgAl_2O_4$ | (100) GeAs ∥ (100) $MgAl_2O_4$ |
| (110) $MgAl_2O_4$ | (100) GeAs ∥ (110) $MgAl_2O_4$ |
| (111) $MgAl_2O_4$ | (111) GeAs ∥ (111) $MgAl_2O_4$ |
| (10$\bar{1}$1) BeO | (111) GeAs ∥ (10$\bar{1}$1) BeO |
| (0001) BeO | (111) GeAs ∥ (0001) BeO |
| (10$\bar{1}$0) BeO | (100) GeAs ∥ (10$\bar{1}$0) BeO |
| (100) $ThO_2$ | (100) GeAs ∥ (100) $ThO_2$ |
| (211) $Gd_3Ga_5O_{12}$ | (111) GeAs ∥ (211) $Gd_3Ga_3O_{12}$ |

FIG. 3 is a photograph showing the surface microstructure of a GaAs film grown epitaxially on spinel ($MgAl_2O_4$) using the inventive process described hereinabove. In the specimen illustrated, the GaAs film has its (111) crystallographic plane parallel to the (111) crystallographic plane of the substrate. The triangular growth features evident in FIG. 3 suggest (111) oriented GaAs. X-ray diffraction examination of the same specimen produced Lane patterns consistent with (111) GaAs growth parallel to the (111) plane of spinel.

The inventive process described hereinabove also has been used to grow epitaxial thin films of Group III-V compound and alloy semiconductors on various single crystal, non-electrically-insulating substrates including, but not limited to, SiC, GaAs, GaP and Ge. In each case, the process steps corresponded substantially to those employed to deposit GaAs, GaP, $GaAs_{1-x}P_x$, $GaAs_{1-x}Sb_x$, $Ga_{1-y}Al_yAs$, and the like on electrically insulating substrates.

It will be understood that various modifications of the herein described process also are considered within the scope of the present invention. For example, after initial nucleation of a GaAs film 13, very small controlled amounts of gaseous $AsCl_3$ and/or HCl may be introduced into reaction chamber 20 together with the arsine and gallium sources. If $AsCl_3$ is used, it dissociates to form HCl in the hydrogen atmosphere. The HCl tends preferentially to etch away or remove some defects in the growing GaAs, thereby providing a more defect-free film 13.

It has also been found beneficial to anneal a film after complete coverage has been achieved, as this removes many defects associated with the growth at the heterogeneous interface. Annealing after a thicker film has been grown has also been found to be beneficial in improving quality.

Further, while exemplary deposition temperatures have been set forth hereinabove, these are not to be considered limiting. For example, growth of GaAs at deposition temperatures above 800 C. may be employed, but there may be some sacrifice in growth rate and possibly film quality.

While the examples above have involved the growth of semiconductor films having As or P as the Group V constituent, the invention is not so limited. Thus as described, films having antimony as a Group V constituent also may be made using the inventive process; for example, by substituting stibine ($SbH_3$) for the arsine or phosphine as discussed supra. The high boiling point of Sb as compared to As or P requires much more careful control of the $SbH_3$ concentration in the growth process.

In another embodiment, the inventive process may be used to produce Group III-V compound semiconductor thin films wherein the Group III constituent comprises indium or aluminum. Thus; for example, an organic alkyl compound of In or Al may be introduced into reactor 20 in the gas phase. This organic compound reacts; e.g., with the hydride of arsenic, phosphorus or antimony to produce on heating InAs, InP, InSb, AlAs, AlP, AlSb, or the like. If the organic compound selected is one which reacts at room temperature with the hydride to form stable intermediate products, it may be desirable to use separate flow lines into reactor 20 for the organic and for the hydride. Preferably, at least one of the flow lines should terminate near the heated substrate.

EXAMPLE II—PREPARATION OF ALUMINUM ARSENIDE (AlAs)

By substituting trimethylaluminum (TMA) for trimethylgallium (TMG) in the process described in Example I, and reacting TMA with $AsH_3$ at the heated pedestal, a single crystal film of aluminum arsenide (AlAs) is produced on a single crystal substrate such as sapphire, spinel, beryllium oxide, chrysoberyl, gallium arsenide, and germanium. An exemplary set of conditions for film growth is the following: temperature of pedestal, 700C; $AsH_3$ (10%) in carrier gas (e.g., $H_2$ or He) at a flow rate of 90 cc per minute into the reactor for about 2 minutes prior to introduction of TMA and then together with TMA carried by 50 cc per minute of carrier gas which had been bubbled through the liquid TMA at room temperature. After 15 minutes of growth, approximately 4 $\mu$m of AlAs will have been grown, noticeably an orange film, transparent as seen through a transparent single crystal inorganic oxide substrate.

The inventive process also may be used to produce Group III-V compound semiconductor thin films wherein the Group III constituent comprises an alloy. For example, by introducing organic compounds of In and Ga, Al and Ga, or In and Al into reactor 20 together with a Group V hydride, alloy semiconductors such as $Ga_{1-y}In_yAs$; $Ga_{1-y}In_yP$; $Ga_{1-y}Al_yP$; $Ga_{1-y}Al_yAs$; $In_{1-y}Al_yP$; $In_{1-y}Al_yAs$ or the like will form on reaction at an elevated temperature. (In each case, y assumes a value between zero and one.) Of course, such systems also can be combined with mixtures of the Group V constituents to form such alloys as: $Ga_{1-y}In_yAs_{1-x}P_x$; $Ga_{1-y}Al_yAs1-xP_x$; $In_{1-y}Al_yAs_{1-x}P_x$ or the like or $(GaAlIn)_a(AsPSb)_b$, where a and b=1.

EXAMPLE III—PREPARATION OF $Ga_xAl_{1-x}As$, an example of alloy Formation

Of the mixed III-V alloys, $Ga_xAl_{1-x}As$ can be prepared by reacting $AsH_3$ with mixtures of TMG and TMA. The composition of the mixture can be changed by adjusting the rates of flow of the carrier gas through the liquid alkyl compounds and then mixing the gases prior to their introduction into the reactor, where reaction with arsine takes place to produce the alloy. The alloy formed is graded in composition; for example, by varying the TMG or TMA concentration during film growth by adjusting the carrier gas flows.

An alternate process for alloy growth of a desired composite would be to mix appropriate amounts of the liquid TMA and TMG together in a bubbler and use a carrier gas such as H₂ or He to transfer predetermined amounts of the alkyls to the reaction zone.

As an alternative to use of the hydride to supply the Group V constituent of the compound semiconductor, in some instances an organic component of the Group V constituent may be used. Examples of such a component include trimethylstibine, $(CH_3)_3Sb$, and trimethylarsine, $(CH_3)_3As$, and trimethylphosphine, $(CH_3)_3P$.

The exemplary set of conditions for alloy growth by the alternate process is the following: pedestal temperature, 700 C.; total carrier gas flow 1.5 liters/minute; carrier flow through TMG at 0 C., 10 cc per minute; carrier flow through TMA of 15 cc per minute; and flow of AsH₃ (10% in carrier) at a rate of 90 cc per minute in the reactor during growth and also about 2 minutes before introduction of the TMG and TMA into the reactor. These growth conditions produced a single crystal alloy with composition $Ga_{0.5}Al_{0.5}As$ on $Al_2O_3$ and GaAs, for example.

Although the invention has been described and illustrated in detail, it is to be clearly understood that the same is by way of illustration and example only and is not to be taken by way of limitation, the spirit and scope of this invention being limited only by the terms of the appended claims.

What is claimed is:

1. A composite comprising a monocrystalline, electrically insulating, oxide substrate and a single crystal film consisting of a Group III–V semiconductor epitaxially disposed on and in direct contact with said substrate in which the Group III constituent of the semiconductor comprises at least one element selected from the class consisting of gallium and indium.

2. A composite comprising a monocrystalline, electrically insulating, oxide substrate and a single crystalline film consisting of a Group III–V semiconductor epitaxially disposed on and in direct contact with said substrate, in which the Group V constituent of the semiconductor comprises at least one element selected from the class consisting of phosphorus, arsenic, and antimony.

3. A composite comprising a monocrystalline, electrically insulating, oxide subtrate and a single crystalline film consisting of a cubic Group III–V semiconductor epitaxially disposed on and in direct contact with said substrate.

4. The composite as recited in claim 1 wherein said semiconductor comprises a solid solution.

5. The composite according to claims 1, 2 or 3 in which said monocrystalline insulating oxide substrate is selected from the class of crystal structures consisting of rhombohedral, orthorhombic, hexagonal and cubic.

6. The composite according to claims 1, 2 or 3 in which said insulating substrate is selected from the class consisting of sapphire, spinel, chrysoberyl, gadolinium gallium garnet, beryllium oxide, and thorium oxide.

7. The composite according to claims 1, 2 or 3 in which the Group III constituent is selected from the class consisting of gallium, aluminum, and indium; and the Group V constituent is selected from the class consisting of arsenic, phosphorus, and antimony.

8. The composite according to claim 6 in which the Group III constituent is selected from the class consisting of gallium, aluminum, and indium; and the Group V constitutent is selected from the class consisting of arsenic, phosphorus, and antimony.

9. The composite according to claim 6 in which the semiconductor compound contains more than one of the Group III elements selected from the class consisting of gallium, aluminum, and indium.

10. The composite according to claim 6 in which the semiconductor compound contains more than one of the Group V elements selected from the class consisting of arsenic, phosphorus and antimony.

11. The composite according to claim 6 in which the semiconductor compound consists of a solid solution of more than one of the elements selected from Group III elements consisting of gallium, aluminum and indium and more than one of the elements selected from Group V elements consisting of arsenic, phosphorus and antimony.

12. The composite according to claims 1, 2 or 3 in which said semiconductor compound is selected from the class consisting of gallium arsenide, gallium phosphide and gallium arsenide-phosphide, aluminum arsenide, gallium-aluminum arsenide, gallium arsenide-antimonide, gallium phosphide-antimonide, aluminum phosphide-antimonide, indium arsenide, indium phosphide and alloy combinations thereof.

13. The composite according to claim 12 in which said Group III-V semiconductor is impurity-doped.

14. The composite according to claim 13 in which said Group III-V semiconductor is donor impurity-doped.

15. The composite according to claim 13 in which said Group III-V semiconductor compound is acceptor impurity-doped.

16. A composite according to claims 1, 2 or 3 in which the insulating substrate is sapphire ($\alpha Al_2O_3$), and the orientation of the surface exposed is selected from the class of orientations consisting of (0001),(11$\overline{2}$5), (11$\overline{2}$6) and their crystallographic equivalents; and the orientation of the crystalline lattice of said single crystal film is the (111) plane.

17. A composite according to claims 1, 2 or 3 in which the insulating substrate is spinel ($MgAl_2O_4$) having the (110) surface exposed, and the orientation of the crystalline lattice of said single crystal film is the (100) plane.

18. A composite according the claims 1, 2 or 3 in which the insulating substrate is gadolinium gallium garnet ($Gd_3Ga_5O_{12}$) having the (211) surface exposed, and the orientation of the crystalline lattice of said single crystal film is the (111) plane.

19. A composite comprising:
an electrically insulating substrate having a cubic monocrystalline structure selected from the group consisting of thorium oxide and barium fluoride; and
a single crystal film consisting of a Group III–V semiconductor epitaxially disposed on and in direct contact with said substrate.

20. The composite according to claim 19 in which the Group III elements are selected from the group consisting of gallium, aluminum, and indium.

21. The composite according to claim 19 in which the Group V elements are selected from the group consisting of arsenic, phosphorus and antimony.

22. The composite according to claim 19 in which said semiconductor compound is selected from the class consisting of gallium arsenide, gallium phosphide, gallium arsenide-phosphide, aluminum arsenide, gallium arsenide-antimonide, gallium phosphide-antimonide, aluminum phosphide-antimonide, indium arsenide, indium phosphide and alloy combinations thereof.

23. The composite according to claim 22 in which said Group III-V semiconductor is impurity doped.

24. A composite as recited in claim 19 wherein said semiconductor film is deposited on said substrate by a metal-organic process.

25. A composite comprising:
an electrically insulating substrate having a cubic monocrystalline structure selected from the group consisting of thorium oxide, calcium fluoride and barium fluoride; and
a single crystal film consisting of a Group III-V semiconductor epitaxially disposed on and in direct contact with said substrate, and wherein the Group III constituent of the semiconductor contains more than one of the Group III elements.

26. A composite comprising:
an electrically insulating substrate having a cubic monocrystalline structure selected from the group consisting of thorium oxide, calcium fluoride and barium fluoride; and
a single crystal film consisting of a Group III-V semiconductor epitaxially disposed on and in direct contact with said substrate, and wherein the Group V constituent of the semiconductor contains more than one of the Group V elements.

27. A composite comprising:
an electrically insulating gadolinium gallium garnet substrate having a cubic monocrystalline structure; and
a single crystal film consisting of a Group III-V semiconductor epitaxially disposed on said substrate.

28. The composite according to claim 27 in which the Group III constituent of the semiconductor contains more than one of the Group III elements.

29. The composite according to claim 27 in which the Group V constituent of the semiconductor contains more than one of the Group V elements.

30. The composite according to claim 27 in which the Group III elements are selected from the group consisting of gallium, aluminum, and indium.

31. The composite according to claim 27 in which the Group V elements are selected from the group consisting of arsenic, phosphorus and antimony.

32. A composite as recited in claim 27 wherein said semiconductor film is deposited on said substrate by a metal-organic process.

33. The composite according to claim 27 in which said semiconductor compound is selected from the class consisting of gallium arsenide, gallium phosphide, gallium arsenide-phosphide, aluminum arsenide, gallium arsenide-antimonide, gallium phosphide-antimonide, aluminum phosphide-antimonide, indium arsenide, indium phosphide and alloy combinations thereof.

34. The composite according to claim 35 in which the Group III-V semiconductor is impurity doped.

35. A composite consisting of:
an electrically insulating monocrystalline substrate selected from the class of crystal structures consisting of rhombohedral, orthorhombic, and hexagonal; and
a single crystalline film consisting of a Group III-V semiconductor epitaxially disposed on and in direct contact with said substrate the constituents of the Group III-V semiconductor being selected from the class consisting of a least one of the Group III elements gallium, aluminum, and indium, and the class consisting of at least one of the Group V elements arsenic, phosphorus and antimony, respectively.

36. A composite according to claim 35, wherein said electrically insulating monocrystalline substrate comprises an oxide.

37. A composite according to claim 35, wherein the constituents of said Group III-V semiconductor are selected from the Group III elements gallium, aluminum and indium, and the Group V elements arsenic, phosphorus and antimony.

38. A composite as recited in claim 35 wherein said semiconductor film is deposited on said substrate by a metal-organic process.

39. A composite according to claim 35 wherein the substrate is selected from the group consisting of sapphire, chrysoberyl and beryllium oxide.

40. The composite according to claim 39 in which the Group III constituent of the semiconductor contains more than one of the Group III elements.

41. The composite according to claim 39 in which the Group V constituent of the semiconductor contains more than one of the Group V elements.

42. The composite according to claim 39 in which said semiconductor compound is selected from the class consisting of gallium arsenide, gallium phosphide, gallium arsenide-phosphide, aluminum arsenide, gallium arsenide-antimonide, gallium phosphide-antimonide, aluminum phosphide-antimonide, indium arsenide, indium phosphide and alloy combinations thereof.

43. The composite according to claim 42 in which said Group III-V semiconductor is impurity doped.

44. A composite consisting of a monocrystalline sapphire substrate, said substrate having an exposed surface with an orientation selected from the class of orientations consisting of $(11\bar{2}5)$, $(11\bar{2}6)$, $(0001)$, $(11\bar{2}3)$, $(01\bar{1}2)$ and their crystallographic equivalents, and a single crystalline film consisting of cubic Group III-V semiconductor expitaxially disposed on said substrate wherein the orientation of the crystalline lattice of said single crystalline film is the (111) plane.

45. A composite comprising a monocrystalline spinel $(MgAl_2O_4)$ substrate having the (110) surface exposed, and a single crystal film consisting of a Group III-V semiconductor epitaxially disposed on and in direct contact with said substrate wherein the orientation of the crystalline lattice of said single crystal film is the (100) plane.

46. A composite comprising a monocrystalline gadolinium gallium garnet substrate having the (211) surface exposed, and a single crystal film consisting of a Group III-V semiconductor epitaxially disposed on said substrate wherein the orientation of the crystalline lattice of said single crystal film is the (111) plane.

47. A composite consisting of a monocrystalline beryllium oxide substrate, said substrate having an exposed surface with an orientation selected from the group of orientations consisting of $(10\bar{1}1)$ and $(0001)$ and a single crystal film consisting of a Group III-V semiconductor epitaxially disposed on said substrate wherein the orientation of the crystalline lattice of said crystal film is the (111) plane.

48. A composite consisting of a monocrystalline beryllium oxide substrate, said substrate having its $(10\bar{1}0)$ surface exposed and a single crystal film consiting of a Group III-V semiconductor epitaxially disposed on said substrate wherein the orientation of the crystalline lattice of said crystal film is the (100) plane.

49. A composite as recited in claims 44, 45, 46, 47 or 48 wherein said semiconductor film is deposited on said substrate by a metal-organic process.

50. A composite consisting of:
an electrically insulating monocrystalline oxide substrate; and
a single crystalline film consisting of a Group III-V semiconductor epitaxially disposed on and in direct contact with said oxide substrate, the constituents of the Group III-V semiconductor being selected from the class consisting of at least one of the Group III elements gallium, aluminum, and indium, and the class consisting of at least one of the Group V elements arsenic, phosphorus and antimony, respectively.

51. A composite according to claim 50 wherein the substrate is selected from the group consisting of sapphire, chrysoberyl and beryllium oxide.

52. A composite as recited in claim 50 wherein said semiconductor film is deposited on said substrate by a metal-organic process.

53. A composite according to claim 51 in which said semiconductor compound is selected from the class consisting of gallium arsenide, gallium phosphide, gallium arsenide-phosphide, aluminum arsenide, gallium arsenide-antimonide, gallium phosphide-antimonide, aluminum phosphide-antimonide, indium arsenide, indium phosphide, gallium aluminum-arsenide, gallium indium-arsenide, gallium indium-antimonide, and alloy combinations thereof.

54. A composite according to claim 53 in which said Group III-V semiconductor is impurity doped.

55. A composite comprising:
an electrically insulating monocrystalline oxide substrate; and
a single crystalline film consisting of a Group III-V semiconductor epitaxially disposed on and in direct contact with said oxide substrate, and wherein the substrate is selected from the group consisting of sapphhire, chrysoberyl and beryllium oxide, and in which the Group III constituent of the semiconductor contains more than one of the Group III elements.

56. A composite comprising:
an electrically insulating monocrystalline oxide substrate; and
a single crystalline film consisting of a Group III-V semiconductor epitaxially disposed on and in direct contact with said oxide substrate, and wherein the substrate is selected from the group consisting of sapphire, chrysoberyl and beryllium oxide, and in which the Group V constituent of the semiconductor contains more than one of the Group V elements.

57. A composite comprising a monocrystalline thorium oxide ($ThO_2$) substrate, and a single crystal film consisting of a Group III-V semiconductor epitaxially disposed on and in direct contact with said substrate.

58. A composite as recited in claim 57 wherein said monocrystalline thorium oxide substrate has the (100) surface exposed.

59. A composite as recited in claim 57 wherein said semiconductor comprises a solid solution.

60. A composite as recited in claim 57 wherein said semiconductor film is deposited on said substrate by a metal-organic process.

61. A composite comprising a monocrystalline chrysoberyl ($Al_2BeO_4$) substrate, and a single crystal film consisting of a Group III-V semiconductor epitaxially disposed on and in direct contact with said substrate.

62. A composite as recited in claim 61 wherein said semiconductor comprises a solid solution.

63. A composite as recited in claim 61 wherein said semiconductor film is deposited on said substrate by a metal-organic process.

64. A composite as recited in claims 57, 58 or 61 wherein said semiconductor comprises a compound of one Group III semiconductor material and one Group V semiconductor material.

65. The composite according to claims 1, 19, 35, 45 or 50 made by the process of:
heating said substrate, and
introducing into said open reactor a first material containing a hydride or halide-free alkyl of at least one Group V constituent of said semiconductor, and, as a second material, at least one halide-free alkyl compound containing at least one of the Group III constituents of said semiconductor.

66. The composite according to claims 1, 19, 35, 45 or 50 employing an electrically insulating substrate made by the process of:
heating said substrate and
introducing into said open reactor a first material containing a hydride or alkyl of at least one Group V constituent of said semiconductor, and, as a second material, at least one organic alkyl compound containing at least one of the Group III constituents of said semiconductor.

67. A composite comprising a monocrystalline, electrically insulating substrate and a single crystalline film consisting of a Group III-V semiconductor epitaxially disposed on and in direct contact with said substrate, and wherein said semiconductor film is deposited on said substrate by a metal-organic process, the constituents of the Group III-V semiconductor being selected from the class consisting of at least one of the Group III elements gallium, aluminum, and indium, and the class consisting of at least one of the Group V elements arsenic, phosphorus and antimony, respectively.

68. The composite according to claims 4, 59, 62 or 67 in which the Group III constituent of the semiconductor solid solution contains more than one of the Group III elements.

69. The composite according to claims 4, 59, 62 or 67 in which the Group V constituent of the semiconductor solid solution contains more than one of the Group V elements.

70. The composite according to claims 4, 59, 62 or 67 in which the Group III and Group V constituents of the semiconductor are solid solutions of Group III elements and Group V elements, respectively.

71. The composite according to claim 68 in which the Group III elements are selected from the class consisting of gallium, aluminum, and indium.

72. The composite according to claim 69 in which the Group V elements are selected from the class consisting of arsenic, phosphorus and antimony.

73. The composite according to claim 70 in which said Group III constituents are selected from the class consisting of gallium, aluminum and indium and said Group V constituents are selected from the class consisting of arsenic, phosphorus and antimony.

74. A composite comprising a monocrystalline, electrically insulating substrate and a single crystal film consisting of a Group III-V semiconductor solid solution epitaxially disposed on and in direct contact with said substrate, said Group III constituents containing more than one of the Group III elements.

75. A composite comprising a monocrystalline, electrically insulating substrate and a single crystal film consisting of a Group III–V semiconductor solid solution epitaxially disposed on and in direct contact with said substrate, said Group V constituent containing more than one of the Group V elements.

* * * * *